(12) United States Patent
Tang et al.

(10) Patent No.: US 11,100,853 B2
(45) Date of Patent: Aug. 24, 2021

(54) OLED DISPLAY MACHINE WITH ILLUMINATION FUNCTION

(71) Applicant: WUHAN CHINA STAR OPTOELECTRONICS TECHNOLOGY CO., LTD., Wuhan (CN)

(72) Inventors: Yuejun Tang, Wuhan (CN); Xueyun Li, Wuhan (CN)

(*) Notice: Subject to any disclaimer, the term of this patent is extended or adjusted under 35 U.S.C. 154(b) by 25 days.

(21) Appl. No.: 16/343,783

(22) PCT Filed: Dec. 27, 2018

(86) PCT No.: PCT/CN2018/124209
§ 371 (c)(1),
(2) Date: Apr. 22, 2019

(87) PCT Pub. No.: WO2020/103286
PCT Pub. Date: May 28, 2020

(65) Prior Publication Data
US 2020/0273398 A1    Aug. 27, 2020

(30) Foreign Application Priority Data
Nov. 22, 2018   (CN) .......................... 201811395706.7

(51) Int. Cl.
*H01L 27/32* (2006.01)
*H01L 51/52* (2006.01)
*G09G 3/3225* (2016.01)

(52) U.S. Cl.
CPC ......... *G09G 3/3225* (2013.01); *H01L 27/322* (2013.01); *H01L 27/3272* (2013.01);
(Continued)

(58) Field of Classification Search
CPC ............... H01L 27/3244; H01L 27/322; H01L 27/3211; H01L 27/12; H01L 27/3262;
(Continued)

(56) References Cited

U.S. PATENT DOCUMENTS

| 10,239,634 B2 * | 3/2019 | Johnson .................... F21V 9/04 |
| 2015/0241025 A1 * | 8/2015 | Steiner ................ F21V 33/0052 |
| | | 362/23.05 |

(Continued)

FOREIGN PATENT DOCUMENTS

| CN | 104900676 A | 9/2015 |
| CN | 105874525 A | 8/2016 |

*Primary Examiner* — Xuemei Zheng

(57) ABSTRACT

An organic light emitting diode (OLED) display machine with an illumination function is provided. The OLED display machine includes a display region, at least one illumination region, and a drive circuit. An organic light-emitting display device is arranged in the display region. Each illumination region is located at one side edge adjacent to the display region. An organic light-emitting illumination device is disposed in the illumination region. The organic light-emitting illumination device includes a substrate, an insulating layer, a planarization layer, an anode electrode, a light-emitting material layer, and a cathode electrode. The drive circuit is electrically connected to the anode electrode and the cathode electrode of the organic light-emitting illumination device to control an ON or OFF state of the organic light-emitting illumination device. Accordingly, the present invention provides not only a display function, but also illumination, so facilitate wide application and development of the OLED display machine.

9 Claims, 4 Drawing Sheets

(52) U.S. Cl.
CPC . *H01L 51/5237* (2013.01); *G09G 2320/0233* (2013.01); *G09G 2330/027* (2013.01); *H01L 2251/533* (2013.01); *H01L 2251/5361* (2013.01)

(58) Field of Classification Search
CPC . H01L 51/56; H01L 51/0097; H01L 51/5246; H01L 51/5262; H01L 51/5271; H01L 51/5036; H01L 2227/323; H01L 2251/5338; H01L 2251/5315; H01L 27/3225; H01L 27/3246; H01L 27/3272; H01L 51/5237; H01L 2251/533; H01L 2251/5361; F21V 23/003; B64D 2203/00; H05B 45/60; G09G 3/3225
See application file for complete search history.

(56) References Cited

U.S. PATENT DOCUMENTS

| | | | |
|---|---|---|---|
| 2016/0164042 A1* | 6/2016 | Cho | H01L 51/5278 257/40 |
| 2017/0194416 A1 | 7/2017 | Chen et al. | |
| 2018/0069196 A1* | 3/2018 | Lee | H01L 27/3262 |
| 2019/0006620 A1* | 1/2019 | Kim | B32B 7/06 |
| 2019/0075243 A1 | 3/2019 | Yamazaki et al. | |

* cited by examiner

OLED DISPLAY MACHINE WITH ILLUMINATION FUNCTION

1. FIELD OF DISCLOSURE

The present invention relates to a field of display devices and in particular, to an organic light emitting diode (OLED) display machine with an illumination function.

2. DESCRIPTION OF RELATED ART

Compared with liquid crystal display (LCD) devices, organic light emitting diode (OLED) displays have advantages such as self-luminescence, fast responses, wide viewing angles, high brightness, colorful colors, and being light in weight. Since OLED displays are thinner and lighter than LCD displays using separate light sources, it is relatively easy for the OLED displays to provide flexible and foldable display features. However, as display devices are used more and more extensively, existing OLED displays are used in terminals, such as a television, a notebook, and a tablet computer. The existing OLED displays have display functions but have no illumination functions, so they fail to provide plenty of functions, lack versatility, and cannot meet the needs of the market.

Accordingly, it is necessary to provide an OLED display machine with an illumination function to solve the existing problems in the conventional techniques.

SUMMARY

It is an objective of the present invention to provide an OLED display machine with an illumination function, which not only provides a display function but also illumination.

Accordingly, the present invention provides an OLED display machine with an illumination function, comprising:

a display region, an organic light-emitting display device being disposed in the display region;

at least one illumination region, each illumination region being disposed at one of side edges adjacent to the display region, an organic light-emitting illumination device being disposed in the illumination region, the organic light-emitting illumination device comprising a substrate, an insulating layer, a planarization layer, an anode electrode, a light-emitting material layer, and a cathode electrode stacked on each other; and a drive circuit, the drive circuit electrically connected to the anode electrode and the cathode electrode of the organic light-emitting illumination device to control an ON or OFF state of the organic light-emitting illumination device.

According to one embodiment of the present invention, the anode electrode, the light-emitting material layer, and the cathode electrode have a same thickness and are disposed corresponding to each other.

According to one embodiment of the present invention, the drive circuit is a thin film transistor (TFT) device or a bonding terminal for being connected to an external signal, and the TFT device and the bonding terminal is in the organic light-emitting illumination device or the organic light-emitting display device.

According to one embodiment of the present invention, the bonding terminal is disposed at another side edge of the display region, and an ON state or an OFF state of the illumination region is controlled by the TFT device or the bonding terminal.

According to one embodiment of the present invention, the organic light-emitting illumination device is selectively disposed in the TFT device or a pixel defining layer, the TFT device is disposed between the substrate and the insulating layer, and the pixel defining layer is disposed on the planarization layer and is disposed adjacent to the light-emitting material layer.

According to one embodiment of the present invention, the organic light-emitting illumination device further comprises a buffer layer, a gate insulating (GI) layer, and an interlayer dielectric layer (ILD) sequentially stacked on each other on the substrate, and the interlayer dielectric layer is disposed under the insulating layer.

According to one embodiment of the present invention, the OLED display machine comprises multiple illumination regions, the illumination regions surround the display region, and each of the illumination regions comprises a plurality of the organic light-emitting illumination devices arranged in an array.

According to one embodiment of the present invention, a circuitry of the drive circuit is disposed between the display region and the illumination region, and the drive circuit is a gate driver circuit, an electrostatic discharge (ESD) circuit or a cathode input circuit.

According to one embodiment of the present invention, the OLED display machine further comprises a protection cover, a cover plate, or a window covering the display region and the at least one illumination region, and the protection cover, the cover plate or the window comprises a shield layer to cover the circuitry.

According to one embodiment of the present invention, the organic light-emitting display device is a bottom-emitting-type organic light-emitting display device.

Moreover, the present invention provides an organic light-emitting diode (OLED) display machine with an illumination function, comprising:

a display region, an organic light-emitting display device being disposed in the display region;

at least one illumination region, each illumination region being disposed at one of side edges adjacent to the display region, an organic light-emitting illumination device being disposed in the illumination region, the organic light-emitting illumination device comprising a substrate, an insulating layer, a planarization layer, an anode electrode, a light-emitting material layer, and a cathode electrode stacked on each other, wherein the anode electrode, the light-emitting material layer, and the cathode electrode have a same thickness and are disposed corresponding to each other; and a drive circuit, the drive circuit being electrically connected to the anode electrode and the cathode electrode of the organic light-emitting illumination device to control an ON or OFF state of the organic light-emitting illumination device.

According to one embodiment of the present invention, the drive circuit is a TFT device or a bonding terminal for being connected to an external signal, and the TFT device or the bonding terminal is disposed in the organic light-emitting illumination device or the organic light-emitting display device.

According to one embodiment of the present invention, the bonding terminal is disposed at another side edge of the display region, and an ON state (turned on) or an OFF state (turned off) of the illumination region is controlled by the TFT device or the bonding terminal.

According to one embodiment of the present invention, the organic light-emitting illumination device is selectively disposed in the TFT device or a pixel defining layer, the TFT device is disposed between the substrate and the insulating layer, and the pixel defining layer is disposed on the planarization layer and is disposed adjacent to the light-emitting material layer.

The present invention provides the following functions. The organic light-emitting illumination device is not provided with a color resist layer or a pixel defining layer, so the anode electrode, the light-emitting material layer, and the cathode electrode can have a larger illuminating area, thereby enabling the organic light-emitting illumination device to emit white light of greater brightness, thus providing high-brightness illumination. The organic light-emitting illumination device is selectively disposed with the TFT device for controlling the ON/OFF state (light is turned on or off) of itself or other organic light-emitting illumination device. Thus, it is simple and easy to control and operate.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without an inventive work or paying the premise.

DETAILED DESCRIPTION OF EMBODIMENTS

The word "embodiment" mentioned in the detailed description means that a particular feature, structure, or characteristic described in connection with the embodiment may be included in at least one embodiment of the invention. The same terms appearing in different places in the specification are not necessarily limited to the same embodiment, but can belong to independent or alternative embodiments. In view of the technical solutions disclosed in the embodiments of the present invention, those skilled in the art should understand that the embodiments described herein may have other combinations or variations based on inventive concepts of the technical solutions.

Embodiments of the present disclosure are described in detail with reference to the accompanying drawings as follows. Directional terms such as up/down, right/left and the like may be used for the purpose of enhancing a reader's understanding about the accompanying drawings, but are not intended to be limiting. Specifically, the terminologies in the embodiments of the present disclosure are merely for the purpose of describing certain embodiments, but not intended to limit the scope of the invention. The same reference numbers are used throughout the drawings to refer to the same or similar parts.

Figure 1:
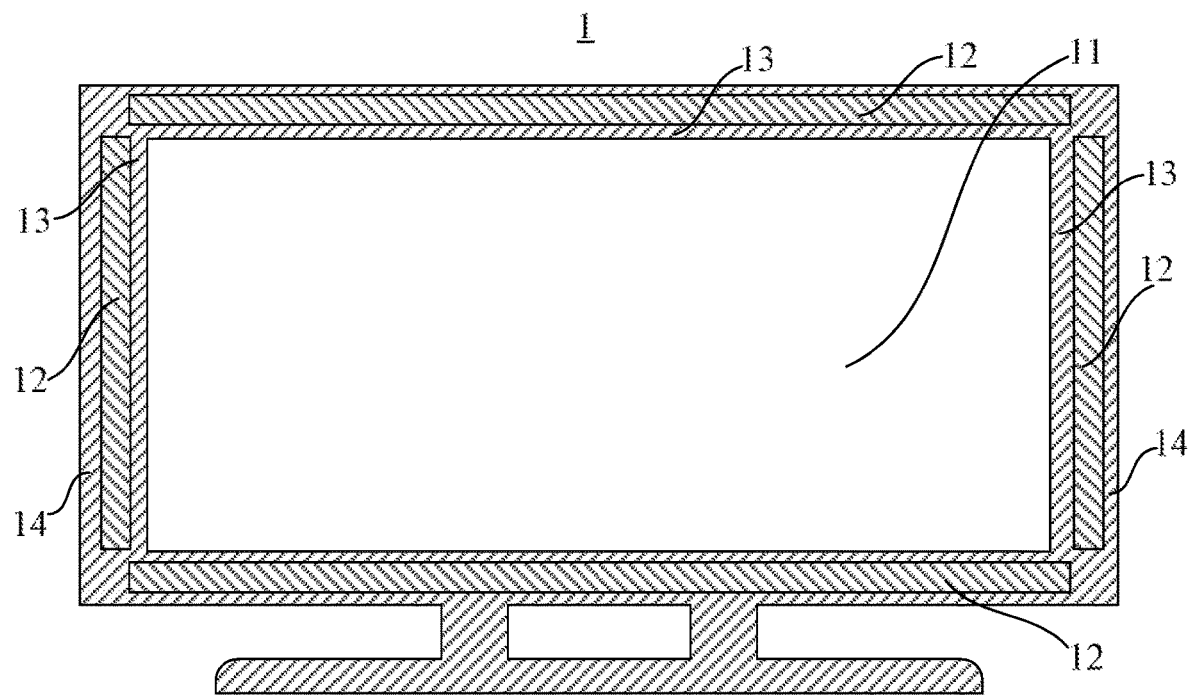
FIG. 1 is a schematic view illustrating an organic light emitting diode (OLED) display machine with an illumination function according to the present invention.
Figure 2A:
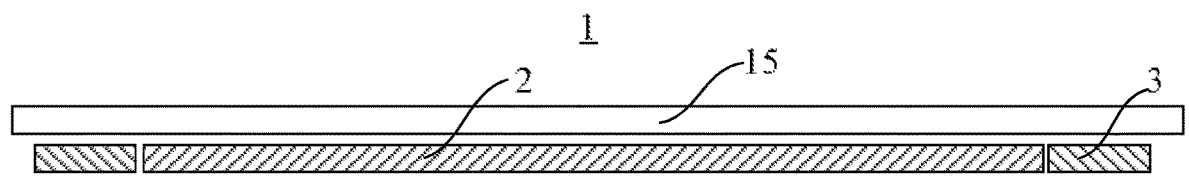
FIG. 2A is a cross-sectional view illustrating the OLED display machine with the illumination function according to the present invention.
Figure 2B:
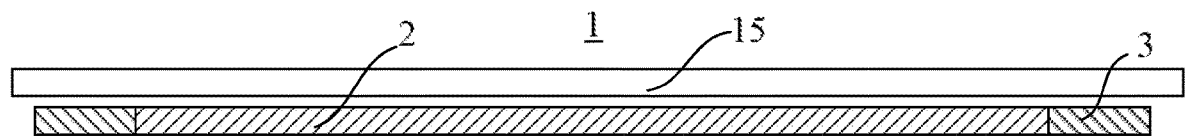
FIG. 2B is another cross-sectional view illustrating the OLED display machine with the illumination function according to the present invention.
Figure 3:
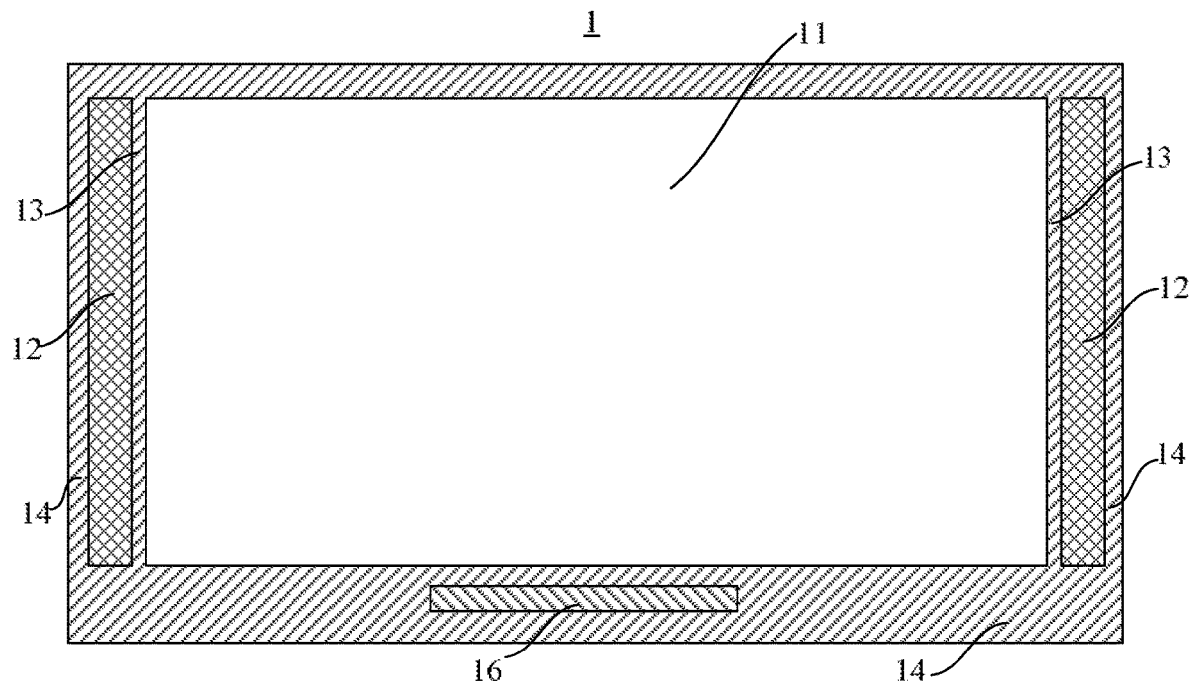
FIG. 3 is another schematic view illustrating the OLED display machine with the illumination function according to the present invention.

Referring to FIGS. 1 to 3, the present invention provides an organic light emitting diode (OLED) display machine 1 with an illumination function—which comprises a display region 11, at least one illumination region 12, and a drive circuit 16. The OLED display machine 1 is preferably a television. However, in alternative embodiments, the OLED display machine can be a notebook computer, a tablet computer, a monitor or other application terminal; the present invention is not limited in this regard.

As shown in FIGS. 1 and 3, multiple illumination regions 12 are provided at, for example, one, two, three, or four side edges 14 of the OLED display machine 1; configuration may vary according to requirements. The illumination regions 12 surround the display region 11. Each illumination region 12 includes a plurality of organic light-emitting illumination devices 2 arranged in an array. Referring to FIGS. 2A and 2B, the OLED display machine 1 further comprises a protection cover 15 covering the display region 11 and the at least one illumination region 12, and comprises a circuitry (not illustrated) of the drive circuit 16, which is disposed between the display region 11 and the illumination region 12. The protection cover 15 is provided with a shield layer 13 to cover the circuitry. The shield layer 13 is black, white, or of other suitable colors. In alternative embodiments, the protection cover 15 can be a cover plate made of glass, or a window, or other suitable plates.

An organic light-emitting display device 2 is disposed in the display region 11. Each of the illumination regions 12 is disposed at one of side edges 14 adjacent to the display region 11, and an organic light-emitting illumination device 3 is disposed in the illumination region 12.

Figure 4:
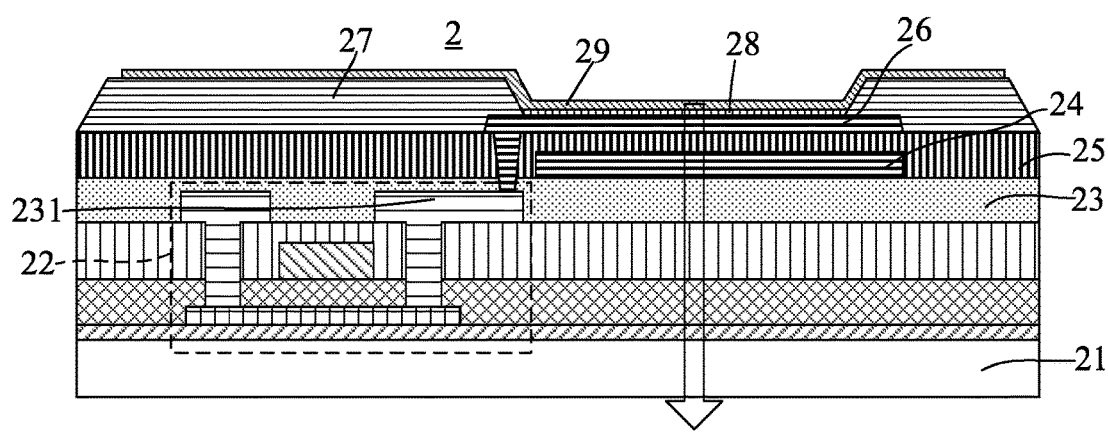
FIG. 4 is a cross-sectional view illustrating an organic light-emitting display device of the OLED display machine with the illumination function according to the present invention.

Referring to FIG. 4, the organic light-emitting display device 2 is preferably a bottom-emitting-type white organic light-emitting display device. The organic light-emitting display device 2 is basically constituted by forming a thin film transistor (TFT) device 22 (for serving as a drive circuit/switch) on a substrate 21 and then disposing an insulating layer 23 on a source/drain electrode 231.

A color resist layer 24 is disposed on the insulating layer 23. The color resist layer 24 is, for example, an RGB color resist layer or an RGBW color resist layer. A planarization layer 25, an anode electrode 26, a pixel defining layer 27, a light-emitting material layer 28, and a cathode electrode 29 are sequentially disposed on the color resist layer 24. The anode electrode 26 is a transparent electrode, and the cathode electrode 29 is a reflective (metal) electrode and has a thickness sufficient to reflect light. When the anode electrode 26 and the cathode electrode 29 send a signal, the light-emitting material layer 28 emits light which passes through the substrate 21 to reach a human eye.

Figure 5:
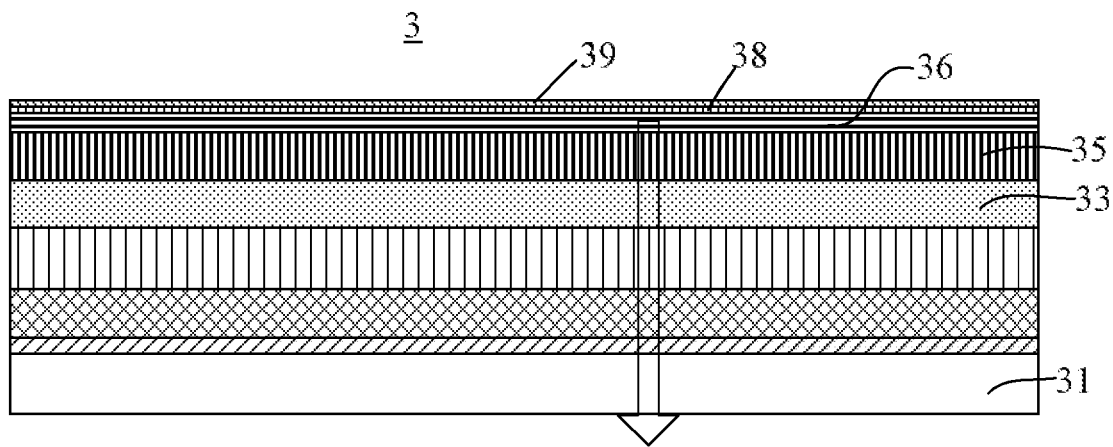
FIG. 5 is a cross-sectional view illustrating an organic light-emitting illumination device according to a first embodiment of the present invention.

Please refer to FIG. 5, which is a cross-sectional view illustrating an organic light-emitting illumination device according to a first embodiment of the present invention. The organic light-emitting illumination device 3 comprises a substrate 31, an insulating layer 33, a planarization layer 35, an anode electrode 36, a light-emitting material layer 38, and a cathode electrode 39. A drive circuit is electrically connected to the anode electrode 36 and the cathode electrode 39 of the organic light-emitting illumination device 3 to control an ON or OFF state of the organic light-emitting illumination device 3. Therefore, the OLED display machine provides not only a display function but also illumination, which facilitate wide application and development of the OLED display machine 1.

In detail, the drive circuit is, for example, a bonding terminal 16 for being connected to an external signal. The bonding terminal 16 is disposed at, for example, the lower one of the side edges 14 in FIG. 3 and is electrically connected to the anode electrode 36 and the cathode electrode 39, thereby providing a drive signal to supply power to the light-emitting material layer 38 and controlling the ON or OFF state of the organic light-emitting illumination device 3. However, according to a second embodiment shown in FIG. 6, a thin film transistor (TFT) device 32 used as a drive circuit/switch can be disposed inside the organic light-emitting illumination device 3, and the TFT device 32 is electrically connected to the anode electrode 36 and the cathode electrode 39 to control an ON or OFF state of the illumination region 12. The drive circuit can even be a TFT device 22 inside the organic light-emitting display device, and the TFT device 22 is electrically connected to the anode electrode 36 and the cathode electrode 39 to control the ON or OFF state of the illumination region 12.

Figure 6:
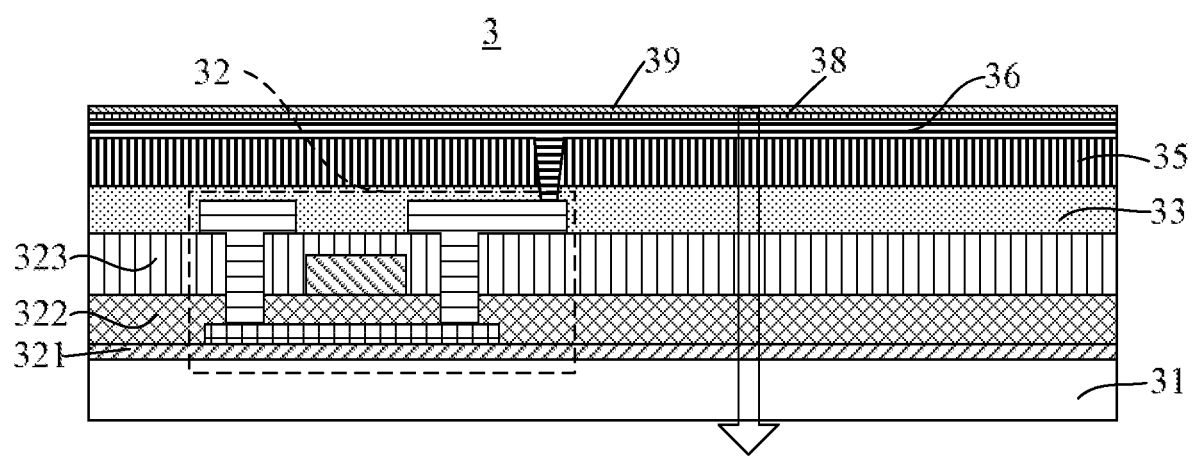
FIG. 6 is a cross-sectional view illustrating an organic light-emitting illumination device according to a second embodiment of the present invention.

In the embodiment shown in FIGS. 5 and 6, the light-emitting material layer 38 referred to herein is preferably a white light device. Further, the anode electrode 36, the light-emitting material layer 38, and the cathode electrode 39 in the drawings are of a same thickness and are disposed corresponding to each other, so that the organic light-emitting illumination device 3 has a larger illuminating area and can emit white light of greater brightness, thus achieving higher brightness illumination. In other words, in the first and second embodiments, since the organic light-emitting illumination device 3 is not provided with the color resist layer (RGBW/RGB) or the pixel defining layer 37, the anode electrode 36, the light-emitting material layer 38, and the cathode electrode 39 can have a larger illuminating area, thereby enabling the organic light-emitting illumination device 3 to emit white light of greater brightness.

Furthermore, as shown in FIG. 6, the organic light-emitting illumination device 3 further comprises a buffer layer 321, a gate insulating (GI) layer 322, and an interlayer dielectric layer (ILD) 323 sequentially stacked on each other on the substrate 31, and the interlayer dielectric layer 323 is disposed under the insulating layer 33. The TFT device 32 is disposed between the substrate 31 and the insulating layer 33 for controlling the ON/OFF state (light is turned on or off) of the TFT device 32 itself or other organic light-emitting illumination device 3. Hence, it is easy and convenient to operate and control.

Figure 7:
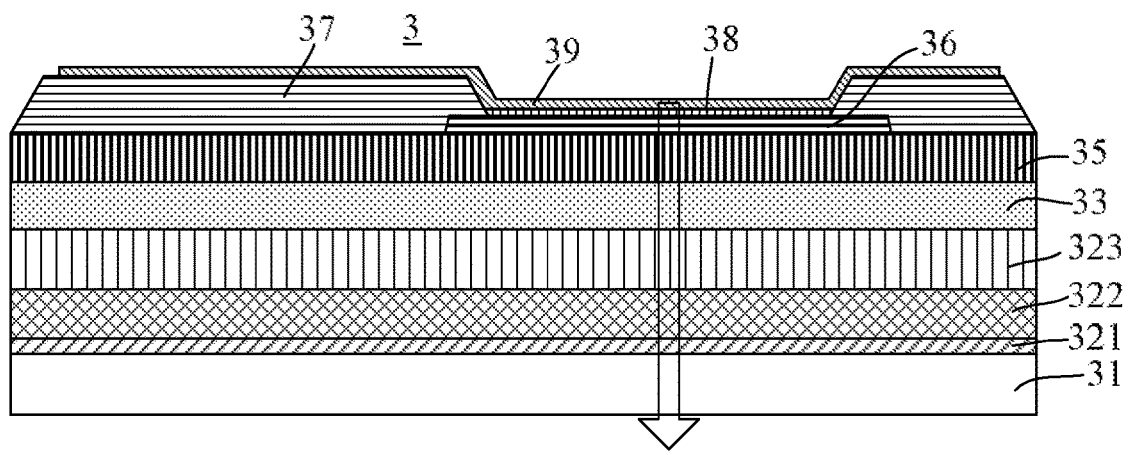
FIG. 7 is a cross-sectional view illustrating an organic light-emitting illumination device according to a third embodiment of the present invention.
Figure 8:
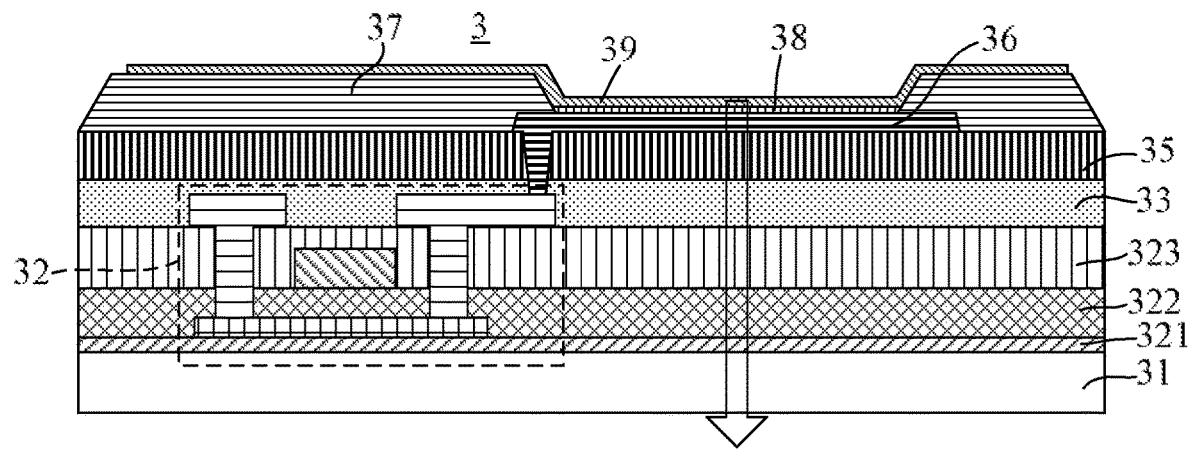
FIG. 8 is a cross-sectional view illustrating an organic light-emitting illumination device according to a fourth embodiment of the present invention.

Please refer to FIGS. 7 and 8, which are cross-sectional views illustrating the organic light-emitting illumination device according to a third embodiment and a fourth embodiment of the present invention. Similarly, in the third and fourth embodiments, the organic light-emitting illumination device 3 can selectively include the pixel defining layer 37 for defining a light transmitting region and an opaque region of each sub-pixel region. In addition, the difference between the embodiments of FIG. 8 and FIG. 7 is that FIG. 8 is further provided with the TFT device 32 as a driving circuit/switch, and is connected to the anode electrode 36 and the cathode electrode 39 of FIG. 7, thereby controlling the ON/OFF state of the organic light-emitting illumination device 3 of FIG. 7.

The drive circuit may be the bonding terminal 16 on a flexible circuit substrate or the TFT device. The drive circuit may also be a gate driver circuit, an electrostatic discharge (ESD) circuit, or a cathode input circuit; the present invention is not limited in this regard.

It should be noted that, a plurality of organic light-emitting illumination devices 3 disposed at any one or more of the side edges 14 may be connected or not connected to the display area 11; configuration may vary according to requirements. In addition, the ON/OFF state of each of the organic light-emitting illumination devices 3 can be controlled through one of the TFT devices 32 (i.e., the drive circuit) arranged separately. Alternatively, multiple organic light-emitting illumination devices 3 (i.e., the illumination regions 12) can be controlled through one switch; configurations may vary according to requirements.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. An organic light-emitting diode (OLED) display machine with an illumination function, comprising:
    a display region, an organic light-emitting display device disposed in the display region;
    at least one illumination region, each illumination region disposed at one of side edges adjacent to the display region, each illumination region being a non-display region, an organic light-emitting illumination device disposed in the illumination region, the organic light-emitting illumination device comprising a substrate, a buffer layer, a gate insulating layer, an interlayer dielectric layer, an insulating layer, a planarization layer, an anode electrode, and a cathode electrode sequentially stacked on each other from bottom to top, the organic light-emitting illumination device not having a color resist layer (RGBW/RGB) and a pixel defining layer in the illumination region; and
    a drive circuit electrically connected to the anode electrode and the cathode electrode of the organic light-emitting illumination device to control an ON or OFF state of the organic light-emitting illumination device.

2. The OLED display machine with the illumination function according to claim 1, wherein the drive circuit is a TFT device or a bonding terminal configured to connect to an external signal, and the TFT device or the bonding terminal is in the organic light-emitting illumination device or the organic light-emitting display device.

3. The OLED display machine with the illumination function according to claim 2, wherein the bonding terminal is disposed at another side edge of the display region, and an ON state (turned on) or an OFF state (turned off) of the illumination region is controlled by the TFT device or the bonding terminal.

4. The OLED display machine with the illumination function according to claim 1, wherein the organic light-emitting illumination device is selectively disposed with the TFT device, and the TFT device is disposed between the substrate and the insulating layer.

5. The OLED display machine with the illumination function according to claim 1, wherein the OLED display machine comprises multiple illumination regions, the illumination regions surround the display region, and each of the illumination regions comprises a plurality of the organic light-emitting illumination devices arranged in an array.

6. The OLED display machine with the illumination function according to claim 1, wherein a circuitry of the drive circuit is disposed between the display region and the illumination region.

7. The OLED display machine with the illumination function according to claim 6, further comprising a protection cover, a cover plate, or a window which covers the display region and the at least one illumination region, and the protection cover, the cover plate, or the window comprises a shield layer to cover the circuitry.

8. The OLED display machine with the illumination function according to claim 1, wherein the organic light-emitting display device is a bottom-emitting-type organic light-emitting display device.

9. The OLED display machine with the illumination function according to claim 1, wherein the anode electrode and the cathode electrode have a same thickness.

* * * * *